United States Patent
Tseng

(10) Patent No.: US 11,875,850 B2
(45) Date of Patent: Jan. 16, 2024

(54) CONTENT ADDRESSABLE MEMORY DEVICE, CONTENT ADDRESSABLE MEMORY CELL AND METHOD FOR DATA SEARCHING WITH A RANGE OR SINGLE-BIT DATA

(71) Applicant: MACRONIX INTERNATIONAL CO., LTD., Hsinchu (TW)

(72) Inventor: Po-Hao Tseng, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 1 day.

(21) Appl. No.: 17/730,259

(22) Filed: Apr. 27, 2022

(65) Prior Publication Data
US 2023/0352087 A1 Nov. 2, 2023

(51) Int. Cl.
*G11C 15/04* (2006.01)
(52) U.S. Cl.
CPC .................. *G11C 15/046* (2013.01)
(58) Field of Classification Search
CPC .................................... G11C 15/046
See application file for complete search history.

(56) References Cited

U.S. PATENT DOCUMENTS

| 8,891,272 | B2 | 11/2014 | Wada | |
| 10,896,731 | B1 * | 1/2021 | Li | G11C 15/046 |
| 2004/0022312 | A1 * | 2/2004 | Jones | H03M 7/46 375/240 |
| 2015/0003164 | A1 | 1/2015 | Roohparvar | |
| 2020/0227123 | A1 | 7/2020 | Salahuddin et al. | |

FOREIGN PATENT DOCUMENTS

| TW | 201346911 A | 11/2013 |
| TW | 201830398 A | 8/2018 |

* cited by examiner

*Primary Examiner* — Sultana Begum
(74) *Attorney, Agent, or Firm* — McClure, Qualey & Rodack, LLP

(57) ABSTRACT

The application provides a content addressable memory (CAM) memory device, a CAM memory cell and a method for searching and comparing data thereof. The CAM memory device includes: a plurality of CAM memory strings; and an electrical characteristic detection circuit. In data searching, a search data is compared with a storage data stored in the CAM memory strings, the CAM memory strings generate a plurality of memory string currents, the electrical characteristic detection circuit detects the memory string currents to generate a plurality of sensing results, or detects a plurality of match line voltages on a plurality of match lines coupled to the CAM memory string to generate the plurality of search results. The storage data and the search data is a range storage data and a single-bit search data, or the storage data and the search data is a single-bit storage data and a range search data.

15 Claims, 12 Drawing Sheets

CONTENT ADDRESSABLE MEMORY DEVICE, CONTENT ADDRESSABLE MEMORY CELL AND METHOD FOR DATA SEARCHING WITH A RANGE OR SINGLE-BIT DATA

BACKGROUND OF THE INVENTION

Field of the Invention

The invention relates in general to a content addressable memory (CAM) memory device, a CAM memory cell and a method for searching and comparing data thereof, and more particularly to a CAM memory device, a CAM memory cell and a method for searching and comparing data thereof, which are capable of implementing in-memory approximate searching.

Description of the Related Art

Along with the booming growth in big data and artificial intelligence (AI) hardware accelerator, data search and data comparison have become essential functions. The existing ternary content addressable memory (TCAM) can be configured to implement highly parallel searching. Conventional TCAM is normally formed by static random access memory (SRAM), and therefore has low memory density and requires high access power. Recently, a non-volatile memory array based on TCAM has been provided to save power consumption through dense memory density.

In comparison to the TCAM based on SRAM having 16 transistors (16T), recently a resistive random access memory (RRAM)-based TCAM having 2-transistor and 2-resistor (2T2R) structure has been provided to reduce cell area. Also, standby power consumption can be reduced through the non-volatile FRAM-based TCAM. However, the existing non-volatile TCAM is difficult to implement range search and range storage. That is, the existing non-volatile TCAM is not capable of implementing in-memory approximate searching, range search and range storage.

Therefore, it has become a prominent task for the industries to provide a CAM memory device, a CAM memory cell and a method for searching and comparing data thereof, which are capable of implementing in-memory approximate searching, range search and range storage.

SUMMARY OF THE INVENTION

According to one embodiment of the present invention, a CAM memory device is provided. The content addressable memory (CAM) memory device includes: a plurality of CAM memory strings; and an electrical characteristic detection circuit coupled to the CAM memory strings; wherein in data searching, a search data is compared with a storage data stored in the CAM memory strings, the CAM memory strings generate a plurality of memory string currents, the electrical characteristic detection circuit detects the memory string currents to generate a plurality of sensing results, or the electrical characteristic detection circuit detects a plurality of match line voltages on a plurality of match lines coupled to the CAM memory string to generate the plurality of search results; the storage data and the search data is a range storage data and a single-bit search data, or the storage data and the search data is a single-bit storage data and a range search data.

According to one embodiment of the present invention, a method for searching and comparing data of a CAM memory device is provided. The method includes: storing a storage data in a plurality of CAM memory strings; performing data searching on the CAM memory strings by a search data; generate a plurality of memory string currents from the CAM memory strings; detecting the memory string currents to generate a plurality of sensing results, or detecting a plurality of match line voltages on a plurality of match lines coupled to the CAM memory string to generate the plurality of search results; wherein the storage data and the search data is a range storage data and a single-bit search data, or the storage data and the search data is a single-bit storage data and a range search data.

According to an alternate embodiment of the present invention, a CAM memory cell is provided. The CAM memory cell includes a plurality of memory cells, wherein the memory cell are serially connected, and a plurality of control terminals of the memory cells receive a plurality of search voltages indicating a search data; or the plurality of control terminals of the memory cells receive a select voltage or a pass voltage, and a plurality of first terminals of the memory cells receive the search voltages via a plurality of signal lines; or the plurality of control terminals of the memory cells are coupled to a plurality of word lines for receiving the search voltages, the first terminals of the memory cells are coupled to a match line and a pre-charge control circuit, and a plurality of second terminals of the memory cells are coupled to ground, wherein a storage data of the CAM memory cell and the search data is a range storage data and a single-bit search data, or the storage data and the search data is a single-bit storage data and a range search data.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1A:
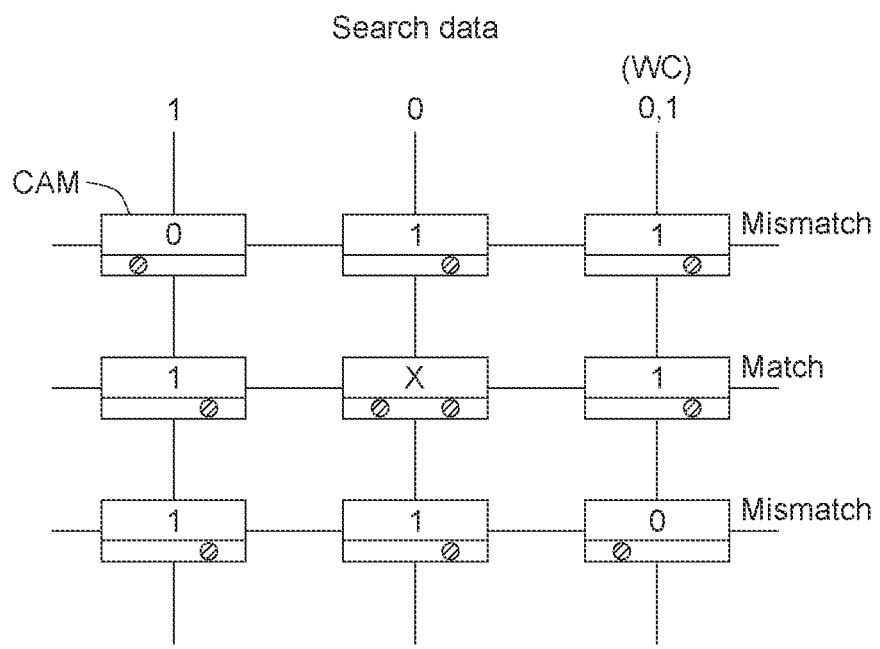
FIG. 1A shows a single-bit storage data and a single-bit search data.

Technical terms are used in the specification with reference to generally-known terminologies used in the technology field. For any terms described or defined in the specification, the descriptions and definitions in the specification shall prevail. Each embodiment of the present disclosure has one or more technical features. Given that each embodiment is implementable, a person ordinarily skilled in the art can selectively implement or combine some or all of the technical features of any embodiment of the present disclosure.

One embodiment of the application provides a CAM memory device, a CAM memory cell and a method for searching and comparing data thereof. A search data is applied to a plurality of CAM memory cells via a plurality of word lines or a plurality of bit lines. Storage data is stored in the CAM memory cells. In one embodiment of the application, the storage data stored in the CAM cells may be a range storage data (that is, the storage data is a range data) and the search data is a single-bit search data. Alternatively, in another embodiment of the application, the storage data stored in the CAM cells may be a single-bit storage data (that is, the storage data is a single-bit data) and the search data is a range search data. The definition of the "range storage data" and the "range search data" is described later.

In one embodiment of the application, in data searching or data comparison, in a matched state, the CAM memory cell provides a cell current; and in a mismatched state, the CAM memory cell does not provide the cell current. In another embodiment of the application, in data searching or data comparison; in a matched state, the CAM memory cell does not provide the cell current; and in a mismatched state, the CAM memory cell provides the cell current.

In one embodiment of the application, when the search data is all matched with the storage data, a memory string provides a high memory string current; when the search data is partially matched with the storage data; a memory string provides a middle memory string current; and when the search data is all mismatched with the storage data, a memory string provides a low memory string current. In another embodiment of the application, when the search data is all matched with the storage data, a memory string provides a low memory string current; when the search data is partially matched with the storage data, a memory string provides a middle memory string current; and when the search data is all mismatched with the storage data, a memory string provides a high memory string current. That is, the value of the memory string current depends on the match degree (or the mismatch degree) between the search data and the storage data.

Further, in another embodiment of the application, when the search data is all matched with the storage data, a match line voltage on a match line is kept without being discharged (that is, no discharge current); when the search data is partially matched with the storage data, the match line voltage on the match line is intermediately discharged (that is, the discharge current is intermediate); and when the search data is all mismatched with the storage data, the match line voltage on the match line is heavily discharged (that is, the discharge current is high). That is, the discharge degree of the match line voltage on the match line depends on the match degree (or the mismatch degree) between the search data and the storage data.

FIG. 1A shows a single-bit storage data and a single-bit search data. Taking the CAM memory cell as a Ternary Content Addressable Memory (TCAM) as an example. The single-bit storage data stored in the CAM memory cell may be logic 1, logic 0 or X (don't care). The single-bit search data may be logic 1, logic 0 or wildcard (WC). When the search data is matched with the storage data, the search result is matched; and vice versa.

Figure 1B:
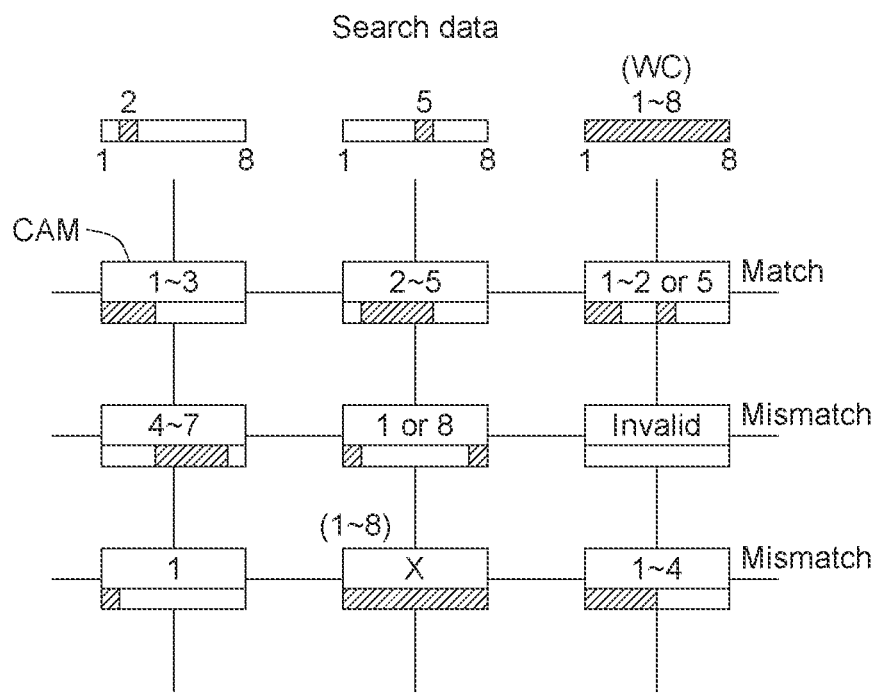
FIG. 1B shows a range storage data and a single-bit search data.

FIG. 1B shows a range storage data and a single-bit search data. The range storage data stored in a single CAM memory cell may be a range data or X (don't care). The range storage data is for example but not limited by, "1~3", "2~5", "1~8" "1~2 or 5" etc. When the search data is matched with the storage data, the search result is matched; and vice versa. As shown in FIG. 1B, in searching the first CAM cell row, when the search data is 2 and the range storage data is 1~3, the search result is matched; when the search data is 5 and the range storage data is 2~5 the search result is matched; and when the search data is wild card (1~8) and the range storage data is "1~2 or 5", the search result is matched. Thus, the search result on the first CAM memory cell row matched.

Figure 1C:
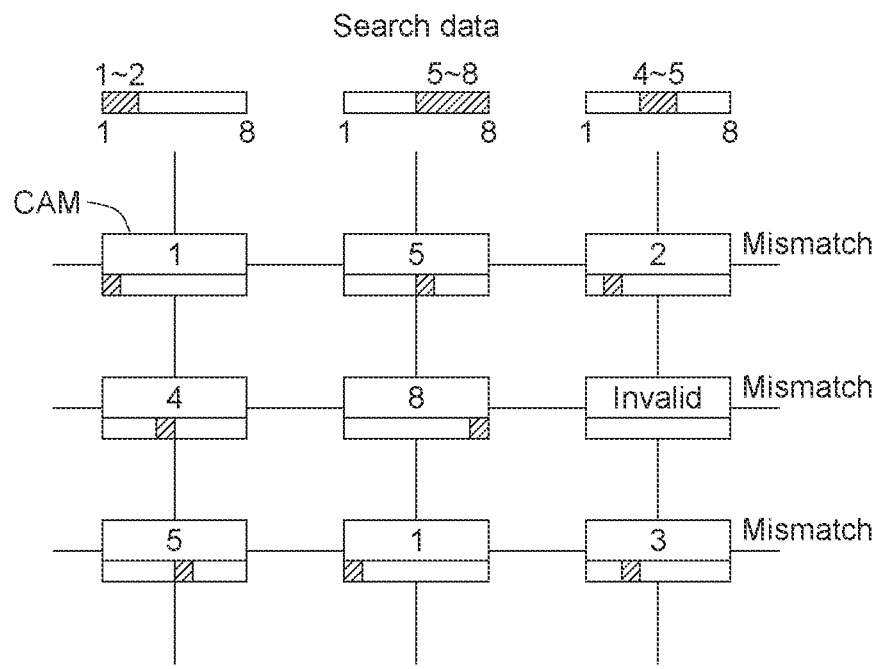
FIG. 1C shows a single-bit storage data and a range search data.

FIG. 1C shows a single-bit storage data and a range search data. The range search data input via the bit line or the word line is for example but not limited by, "1~2", "4~5" etc. When the search data is matched with the storage data, the search result is matched; and vice versa. As shown in FIG. 1C, in searching the first CAM cell row, when the search data is 1~2 and the storage data is 1 the search result is matched; when the search data is 5~8 and the range storage data is 5, the search result is matched; and when the search data is 4~5 and the range storage data is 2, the search result is mismatched. Thus, the search result on the first CAM memory cell row is mismatched.

In one embodiment of the application, when a single CAM memory cell includes N flash memory cells (N being a positive integer larger or equal to 3), the encoding definition of the N flash memory cells is as follows.

When the N flash memory cells are encoded for one decimal data combinations (0, 1, 2, . . . N), that is, when the CAM memory cell is used for storing one among (0, 1, 2, . . . N), the N flash memory cells are encoded as: one cell for high threshold voltage ("0") and (N−1) cells for low threshold voltage ("1"), or one cell for low threshold voltage ("1") and (N−1) cells for high threshold voltage ("0"). Thus, there are $C_{N-1}^N$ combinations.

When the N flash memory cells are encoded for two decimal data combinations (0&1, 0&2, 1&3, . . . (N−1) &N), that is, when the CAM memory cell is used for storing one among (0&1, 0&2, 1&3, . . . (N−1)&N), the N flash memory cells are encoded as: two cells for high threshold voltage ("0") and (N−2) cells for low threshold voltage ("1"), or two cells for low threshold voltage ("1") and (N−2) cells for high threshold voltage ("0"). Thus, there are $C_{N-2}^N$ combinations.

When the N flash memory cells are encoded for three decimal data combinations (0&1&2, 0&1&3, . . . (N−2)& (N−1)&N), that is, when the CAM memory cell is used for storing one among (O&1&2, 0&1&3, . . . (N−2)&(N−1) &N), the N flash memory cells are encoded as: three cells for high threshold voltage ("0") and (N−3) cells for low threshold voltage ("1"), or three cells for low threshold voltage ("1") and (N−3) cells for high threshold voltage ("0"). Thus, there are $C_{N-3}^N$ combinations.

When the N flash memory cells are encoded for N decimal data combinations (0&1&2 . . . &N), that is, when the CAM memory cell is used for storing (0&1&2 . . . &N), the N flash memory cells are encoded as: N cells for high threshold voltage ("0") and 0 cells for low threshold voltage ("1"), or N cells for low threshold voltage ("1") and 0 cells for high threshold voltage ("0"). Thus, there are $C_N^N$ combinations.

In one embodiment of the application, a search data is defined by N search voltages, the encoding definition of the N search voltages are as follows.

When the N search voltages are encoded for one decimal data combinations (0, 1, 2, . . . N), that is, when the search data is used for representing one among (0, 1, 2, . . . N), the N search voltages are encoded as: one search voltage for high search voltage (being VH, VH2, VD or VS, which is described later) and (N−1) search voltages for low search voltage (being VL, VH1, 0V or 0V, which is described later), or one search voltage for low search voltage and (N−1) search voltages for high search voltage. Thus, there are $C_{N-1}^N$ combinations.

When the N search voltages are encoded for two decimal data combinations (0&1, 0&2, 1&3, . . . (N−1)&N), that is, when the search data is used for representing one among (0&1, 0&2, 1&3, . . . (N−1)&N), the N search voltages are encoded as: two search voltages for high search voltage and (N−2) search voltages for low search voltage, or two search voltages for low search voltage and (N−2) search voltages for high search voltage. Thus, there are $C_{N-2}^N$ combinations.

When the N search voltages are encoded for three decimal data combinations (0&1&2, 0&1&3, . . . (N−2)&(N−1)&N), that is, when the search data is used for representing one among (0&1&2, 0&1&3, . . . (N−2)&(N−1)&N), the N search voltages are encoded as: three search voltages for high search voltage and (N−3) search voltages for low search voltage, or three search voltages for low search voltage and (N−3) search voltages for high search voltage. Thus, there are $C_{N-3}^N$ combinations.

When the N search voltages are encoded for N decimal data combinations (0&1&2 . . . &N), that is, when the search data is used for representing (0&1&2 . . . &N), the N search voltages are encoded as: N search voltages for high search voltage and zero search voltage for low search voltage, or N search voltages for low search voltage and zero search voltage for high search voltage. Thus, there are $C_N^N$ combinations.

First Embodiment

In a first embodiment of the application, in order to implement "the range storage and the single-bit search", the threshold voltages of the flash memory cells of the CAM memory cell and the search voltages are set as table 1-1. In the following, the CAM memory cell includes four flash memory cells, but the application is not limited by this.

TABLE 1-1

| Storage data | Threshold voltages | Search data | Search voltages |
|---|---|---|---|
| Invalid data | 1111 or 0000 | Invalid data | HHHH or LLLL |
| 0 | 1110 or 0001 | 0 | HHHL or LLLH |
| 1 | 1101 or 0010 | 1 | HHLH or LLHL |
| 2 | 1011 or 0100 | 2 | HLHH or LHLL |

TABLE 1-1-continued

| Storage data | Threshold voltages | Search data | Search voltages |
|---|---|---|---|
| 3 | 0111 or 1000 | 3 | LHHH or HLLL |
| 0, 1 | 1100 or 0011 | N/A | N/A |
| 2, 3 | 0011 or 1100 | N/A | N/A |
| 0, 2 | 1010 or 0101 | N/A | N/A |
| 1, 3 | 0101 or 1010 | N/A | N/A |
| 1, 2 | 1001 or 0110 | N/A | N/A |
| 0, 3 | 0110 or 1001 | N/A | N/A |
| 0, 1, 2 | 1000 or 0111 | N/A | N/A |
| 1, 2, 3 | 0001 or 1110 | N/A | N/A |
| 0, 2, 3 | 0010 or 1101 | N/A | N/A |
| 0, 1, 3 | 0100 or 1011 | N/A | N/A |
| 0, 1, 2, 3 (XX) | 0000 or 1111 | 0, 1, 2, 3 (WC) | LLLL or HHHH |

In Table 1-1, when the threshold voltages of the four flash memory cells are 1101 or 0010, the storage data in the CAM memory cell is 1; and when the four search voltages are HHLH or LLHL, the search data is 1.

When the storage data is XX (don't care), the search result is matched, no matter what the search data is. When the storage data is the invalid data, the search result is mismatched, no matter what the search data is. When the search data is wild card (WC), the search result is matched, no matter what the storage data is. When the search data is the invalid data, the search result is mismatched; no matter what the storage data is.

In a first embodiment of the application, in order to implement "the single-bit storage and the range search", the threshold voltages of the flash memory cells of the CAM memory cell and the search voltages are set as table 1-2.

TABLE 1-2

| Storage data | Threshold voltages | Search data | Search voltages |
|---|---|---|---|
| Invalid data | 1111 or 0000 | Invalid data | HHHH or LLLL |
| 0 | 1110 or 0001 | 0 | HHHL or LLLH |
| 1 | 1101 or 0010 | 1 | HHLH or LLHL |
| 2 | 1011 or 0100 | 2 | HLHH or LHLL |
| 3 | 0111 or 1000 | 3 | LHHH or HLLL |
| N/A | N/A | 0, 1 | HHLL or LLHH |
| N/A | N/A | 2, 3 | LLHH or HHLL |
| N/A | N/A | 0, 2 | HLHL or LHLH |
| N/A | N/A | 1, 3 | LHLH or HLHL |
| N/A | N/A | 1, 2 | HLLH or LHHL |
| N/A | N/A | 0, 3 | LHHL or HLLH |
| N/A | N/A | 0, 1, 2 | HLLL or LHHH |
| N/A | N/A | 1, 2, 3 | LLLH or HHHL |
| N/A | N/A | 0, 2, 3 | LLHL or HHLH |
| N/A | N/A | 0, 1, 3 | LHLL or HLHH |
| 0, 1, 2, 3 (XX) | 0000 or 1111 | 0, 1, 2, 3 (WC) | LLLL or HHHH |

Second Embodiment

Figure 2A:
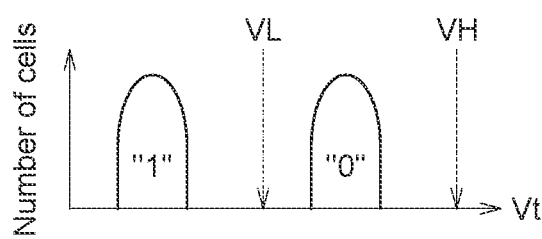
FIG. 2A is a schematic diagram of a CAM memory cell and the threshold voltage distribution according to a second embodiment of the present application.
Figure 2A:
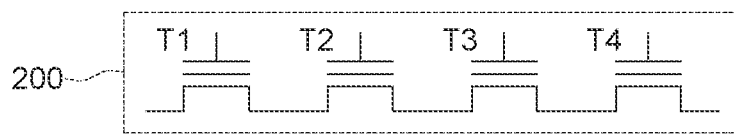

FIG. 2A is a schematic diagram of a CAM memory cell 200 and the threshold voltage distribution according to a second embodiment of the present application.

The CAM memory cell 200 includes a plurality of serial-coupled flash memory cells, wherein the flash memory cells can be realized but is not limited to floating gate memory cells, silicon-oxide-nitride-oxide-silicon (SONOS) memory cells, floating dot memory cells, ferroelectric FET (FeFET) memory cells, resistive random-access memory (RRAM or ReRAM), phase-change memory (PCM) and conductive-bridging RAM (CBRAM), In FIG. 2A, the CAM memory cell 200 includes four serially-connected flash memory cells T1~T4, but the application is not limited by. In other embodiments of the application, the CAM memory cell includes N serially-connected flash memory cells, wherein N is a positive integer higher or equal to 3.

The gates of the flash memory cells T1~T4 are coupled to the word lines WL1~WL4, for receiving the first to the four search voltages SL_1~SL_4, respectively. The source of the flash memory cell T1 is electrically connected to the drain of the flash memory cell T2 and so on. The drain Di of the flash memory cell T1 and the source of the flash memory cell T4 are electrically connected to other signal lines (not shown).

Storage data of the CAM memory cell 200 is determined based on a combination of a plurality of threshold voltages of the flash memory cells T1~T4.

As shown in FIG. 2A, in the second embodiment of the application; when the flash memory cell has a high threshold voltage HVT, the flash memory cell stores logic 0; and when the flash memory cell has a low threshold voltage LVT, the flash memory cell stores logic 1. Further, the reference search voltages VH(H) and VL(L) (VH>VL) refer to the possible values of the first search voltage SL_1 to the fourth second search voltage SL_4.

Moreover, in the second embodiment of the present application, encoding on the threshold voltages of the flash memory cells and the first to the fourth search voltages may be used to implement "range storage and single-bit search" and "single-bit storage and range search" as follows.

"Range storage and single-bit search" in the second embodiment of the present application:

In the second embodiment of the present application, encoding on the threshold voltages of the flash memory cells and the first to the fourth search voltages may be used to implement "range storage and single-bit search" as the following table 2-1.

TABLE 2-1

| Storage data | Threshold voltages | Search data | Search voltages |
| --- | --- | --- | --- |
| Invalid data | 0000 | Invalid data | VH VH VH VH |
| 0 | 0001 | 0 | VH VH VH VL |
| 1 | 0010 | 1 | VH VH VL VH |
| 2 | 0100 | 2 | VH VL VH VH |
| 3 | 1000 | 3 | VL VH VH VH |
| 0, 1 | 0011 | N/A | N/A |
| 2, 3 | 1100 | N/A | N/A |
| 0, 2 | 0101 | N/A | N/A |
| 1, 3 | 1010 | N/A | N/A |
| 1, 2 | 0110 | N/A | N/A |
| 0, 3 | 1001 | N/A | N/A |
| 0, 1, 2 | 0111 | N/A | N/A |
| 1, 2, 3 | 1110 | N/A | N/A |
| 0, 2, 3 | 1101 | N/A | N/A |
| 0, 1, 3 | 1011 | N/A | N/A |
| 0, 1, 2, 3 (XX) | 1111 | 0, 1, 2, 3 (WC) | VL VL VL VL |

In the table 2-1, when the threshold voltages of the flash memory cells T1·T4 are 0001, storage data of the CAM memory cell is "1", and when the search voltages SL_1~SL_4 are VH, VH, VL and VH, respectively, the search data is "1".

"Single-bit storage and range search" in the second embodiment of the present application:

In the second embodiment of the present application, encoding on the threshold voltages of the flash memory cells and the first to the fourth search voltages may be used to implement "single-bit storage and range search" as the following table 2-2.

TABLE 2-2

| Storage data | Threshold voltages | Search data | Search voltages |
| --- | --- | --- | --- |
| Invalid data | 1111 | Invalid data | VH VH VH VH |
| 0 | 1110 | 0 | VH VH VH VL |
| 1 | 1101 | 1 | VH VH VL VH |
| 2 | 1011 | 2 | VH VL VH VH |
| 3 | 0111 | 3 | VL VH VH VH |
| N/A | N/A | 0, 1 | VH VH VL VL |
| N/A | N/A | 2, 3 | VL VL VH VH |
| N/A | N/A | 0, 2 | VH VL VH VL |
| N/A | N/A | 1, 3 | VL VH VL VH |
| N/A | N/A | 1, 2 | VH VL VL VH |
| N/A | N/A | 0, 3 | VL VH VH VL |
| N/A | N/A | 0, 1, 2 | VH VL VL VL |
| N/A | N/A | 1, 2, 3 | VL VL VL VH |
| N/A | N/A | 0, 2, 3 | VL VL VH VL |
| N/A | N/A | 0, 1, 3 | VL VH VL VL |
| 0, 1, 2, 3 (XX) | 0000 | 0, 1, 2, 3 (WC) | VL VL VL VL |

FIG. 2A also shows the threshold voltage distribution in the second embodiment of the application.

In the second embodiment, the voltage difference between the search voltage (applied to the word line) and the threshold voltage is referred as a gate overdrive voltage (GO). In a matched state, the gate overdrive voltage is higher than a threshold value and the transistor provides a high cell current; and in a mismatched state, the gate overdrive voltage is lower than the threshold value and the transistor provides a low cell current. Taking FIG. 2A as an example, the reference search voltages VH and VL may be 6V and 2V, respectively, the high reference threshold voltage HVT is for example but not limited by 6V while the low threshold voltage LVT is for example but not limited by, being 2V. The gate overdrive voltage between the reference search voltage VH and the high reference threshold voltage HVT is about 2V, which is a high gate overdrive voltage; the gate overdrive voltage between the reference search voltage VL and the low threshold voltage LVT is about higher than 6V, which is a high gate overdrive voltage; the gate overdrive voltage between the reference search voltage VL and the high reference threshold voltage HVT is about being smaller than 0V, which is a low gate overdrive voltage; the gate overdrive voltage between the reference search voltage VL and the low threshold voltage LVT is about higher than 2V, which is a high gate overdrive voltage.

In details, when the search voltage is the high reference search voltage VH, no matter the threshold voltage of the transistor is either the low threshold voltage LVT or the high threshold voltage HVT, the gate overdrive voltage of the transistor is higher than the threshold value and thus the transistor provides a cell current. In the case that the search voltage is the low reference search voltage VL, (1) when the threshold voltage of the transistor is the low threshold voltage LVT, the gate overdrive voltage of the transistor is higher than the threshold value and thus the transistor provides the cell current; and (2) when the threshold voltage of the transistor is the high threshold voltage HVT, the gate overdrive voltage of the transistor is lower than the threshold value and thus the transistor provides no any cell current.

Figure 2B:
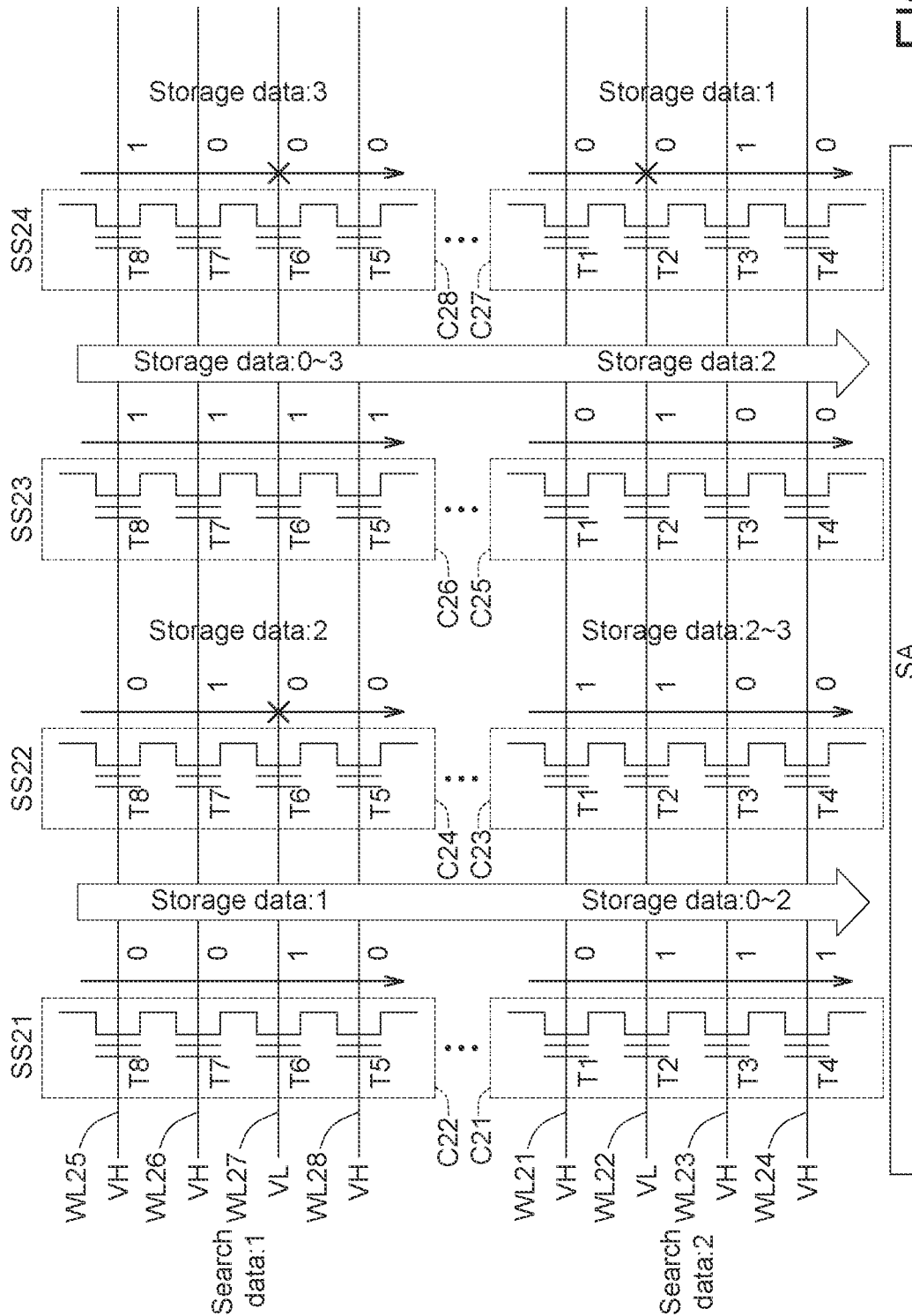
FIG. 2B shows "range storage and single-bit search" operation according to the second embodiment of the application.

FIG. 2B shows "range storage and single-bit search" operation according to the second embodiment of the application. In the memory strings SS21~SS24, the CAM memory cells C21~C28 have storage data as shown, Search data being 2 and 1 is taken as an example. The search data is input into the CAM memory cells C21~C28 via the word lines WL21~WL28.

The search data is 2 (the search voltages are VH, VL, VH, VH) and the four threshold voltages of the CAM memory cell C21 are 0111 (the CAM memory cell C21 has range storage as 0~2). Thus, the four flash memory cells T1~T4 of the CAM memory cell C21 all provide the cell current and the search result on the CAM memory cell C21 is matched. The search data is 1 (the search voltages are VH, VH, VL, VH) and the four threshold voltages of the CAM memory cell C22 are 0010 (the CAM memory cell C21 has range storage as 1). Thus, the four flash memory cells T~T4 of the CAM memory cell C22 all provide the cell current and the search result on the CAM memory cell C22 is matched. Therefore, the memory string SS1 generates the match current to the sensing amplifier SA (also referred as a current detection circuit or an electrical characteristic detection circuit), which means the search result on the memory string SS21 is matched.

Similarly, the memory string SS22 does not generate any match current to the sensing amplifier SA which means the search result on the memory string SS22 is mismatched. The memory string SS23 generates the match current to the sensing amplifier SA which means the search result on the memory string SS23 is matched. The memory string SS24 does not generate any match current to the sensing amplifier SA which means the search result on the memory string SS24 is mismatched.

Third Embodiment

Figure 3A:
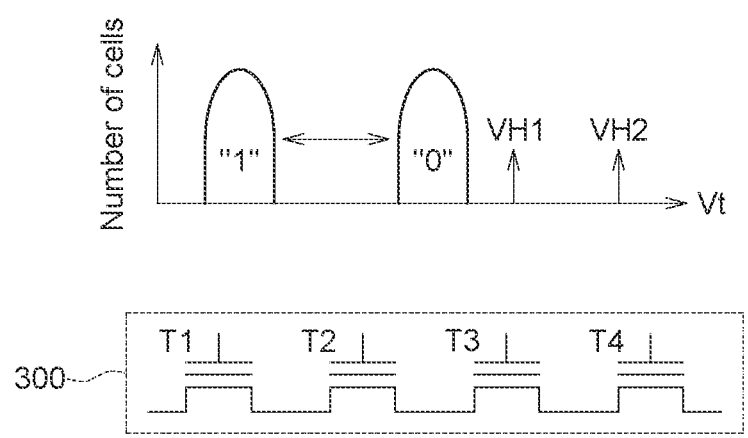
FIG. 3A is a schematic diagram of a CAM memory cell and the threshold voltage distribution according to a third embodiment of the present application.

FIG. 3A is a schematic diagram of a CAM memory cell 300 and the threshold voltage distribution according to a third embodiment of the present application. The CAM memory cell 300 may have the same or similar circuit structure as the CAM memory cell 200 and thus the details are omitted here.

As shown in FIG. 3A, in the third embodiment of the application, when the flash memory cell has a high threshold voltage HVT (for example but not limited by 3~4V), the flash memory cell stores logic 0; and when the flash memory cell has a low threshold voltage LMT (for example but not limited by being lower than 0V), the flash memory cell stores logic 1. Further, the reference search voltages VH1 and VH2 (VH2>VH1) refer to the possible values of the first search voltage SL_1 to the fourth second search voltage SL_4, wherein the reference search voltages VH1 and VH2 are for example but not limited by, 5V and 8V, respectively.

Moreover, in the third embodiment of the present application, encoding on the threshold voltages of the flash memory cells and the first to the fourth search voltages may be used to implement "range storage and single-bit search" and "single-bit storage and range search" as follows.

"Range storage and single-bit search" in the third embodiment of the present application:

In the third embodiment of the present application, encoding on the threshold voltages of the flash memory cells T1~T4 and the first to the fourth search voltages SL_1~SL_4 may be used to implement "range storage and single-bit search" as the following table 3-1.

TABLE 3-1

| Storage data | Threshold voltages | Search data | Search voltages |
|---|---|---|---|
| Invalid data | 0000 | Invalid data | VH2 VH2 VH2 VH2 |
| 0 | 0001 | 0 | VH2 VH2 VH2 VH1 |
| 1 | 0010 | 1 | VH2 VH2 VH1 VH2 |
| 2 | 0100 | 2 | VH2 VH1 VH2 VH2 |
| 3 | 1000 | 3 | VH1 VH2 VH2 VH2 |
| 0, 1 | 0011 | N/A | N/A |
| 2, 3 | 1100 | N/A | N/A |
| 0, 2 | 0101 | N/A | N/A |
| 1, 3 | 1010 | N/A | N/A |
| 1, 2 | 0110 | N/A | N/A |
| 0, 3 | 1001 | N/A | N/A |
| 0, 1, 2 | 0111 | N/A | N/A |
| 1, 2, 3 | 1110 | N/A | N/A |
| 0, 2, 3 | 1101 | N/A | N/A |
| 0, 1, 3 | 1011 | N/A | N/A |
| 0, 1, 2, 3 (XX) | 1111 | 0, 1, 2, 3 (WC) | VH1 VH1 VH1 VH1 |

In the table 3-1, when the threshold voltages of the flash memory cells T1~T4 are 0001, storage data of the CAM memory cell is "1"; and when the search voltages SL_1~SL_4 are VH2, VH2, VH1 and VH2, respectively, the search data is "1".

"Single-bit storage and range search" in the third embodiment of the present application:

In the third embodiment of the present application, encoding on the threshold voltages of the flash memory cells T1~T4 and the first to the fourth search voltages SL_1~SL_4 may be used to implement "single-bit storage and range search" as the following table 3-2.

TABLE 3-2

| Storage data | Threshold voltages | Search data | Search voltages |
|---|---|---|---|
| Invalid data | 1111 | Invalid data | VH2 VH2 VH2 VH2 |
| 0 | 1110 | 0 | VH2 VH2 VH2 VH1 |
| 1 | 1101 | 1 | VH2 VH2 VH1 VH2 |
| 2 | 1011 | 2 | VH2 VH1 VH2 VH2 |
| 3 | 0111 | 3 | VH1 VH2 VH2 VH2 |
| N/A | N/A | 0, 1 | VH2 VH2 VH1 VH1 |
| N/A | N/A | 2, 3 | VH1 VH1 VH2 VH2 |
| N/A | N/A | 0, 2 | VH2 VH1 VH2 VH1 |
| N/A | N/A | 1, 3 | VH1 VH2 VH1 VH2 |
| N/A | N/A | 1, 2 | VH2 VH1 VH1 VH2 |
| N/A | N/A | 0, 3 | VH1 VH2 VH2 VH1 |
| N/A | N/A | 0, 1, 2 | VH2 VH1 VH1 VH1 |
| N/A | N/A | 1, 2, 3 | VH1 VH1 VH1 VH2 |
| N/A | N/A | 0, 2, 3 | VH1 VH1 VH2 VH1 |
| N/A | N/A | 0, 1, 3 | VH1 VH2 VH1 VH1 |
| 0, 1, 2, 3 (XX) | 0000 | 0, 1, 2, 3 (WC) | VH1 VH1 VH1 VH1 |

FIG. 3A also shows the threshold voltage distribution in the third embodiment of the application.

When the search voltage is the high reference search voltage VH2, no matter the threshold voltage of the transistor is either the low threshold voltage LVT or the high threshold voltage HVT, the gate overdrive voltage of the transistor is higher than the threshold value and thus the transistor provides a cell current. In the case that the search voltage is the low reference search voltage VH1, (1) when the threshold voltage of the transistor is the low threshold voltage LVT, the gate overdrive voltage of the transistor is higher than the threshold value and thus the transistor provides the cell current; and (2) when the threshold voltage of the transistor is the high threshold voltage HVT, the gate overdrive voltage of the transistor is lower than the threshold value and thus the transistor provides no any cell current.

Figure 3B:
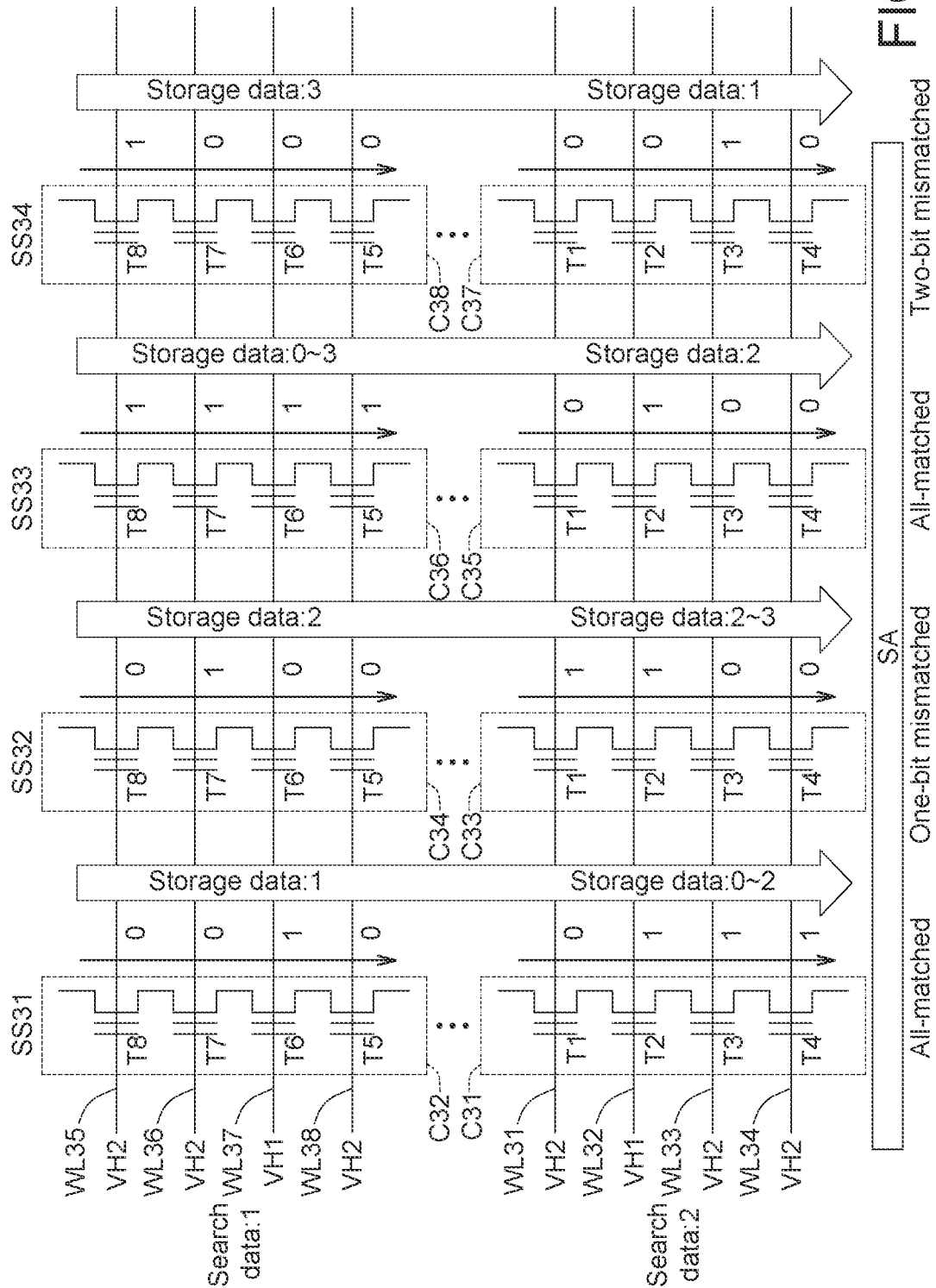
FIG. 3B shows "range storage and single-bit search" operation according to the third embodiment of the application.

FIG. 3B shows "range storage and single-bit search" operation according to the third embodiment of the application. In the memory strings SS31~SS34, the CAM memory cells C31~C38 have storage data as shown. Search data being 2 and 1 is taken as an example. The search data is input into the CAM memory cells C31~C38 via the word lines WL31~WL38.

Taking the memory string SS32 as an example. The search data is 2 (the search voltages are VH2, VH1, VH2 and VH2) and the four threshold voltages of the CAM memory cell C33 are 1100 (the CAM memory cell C33 has range storage as 2~3). Thus, the four flash memory cells T1~T4 of the CAM memory cell C33 all provide the cell current. The search data is 1 (the search voltages are VH2, VH2, VH1 and VH2) and the four threshold voltages of the CAM memory cell C34 are 0100 (the CAM memory cell C34 has range storage as 2). Thus, the flash memory cells T1, T2 and T4 of the CAM memory cell C34 provide the cell current but the flash memory cell T3 of the CAM memory cell C34 does not provide the cell current. The sensing result of the sensing amplifier SA on the memory string SS32 indicates one-bit mismatch.

Similarly, the sensing result of the sensing amplifier SA on the memory string SS31 indicates all match; the sensing result of the sensing amplifier SA on the memory string SS33 indicates all match; and the sensing result of the sensing amplifier SA on the memory string SS34 indicates two-bit mismatch.

That is, in the third embodiment of the application, when the match result is all match, a highest current is sensed; when the match result is partial match, an intermediate current is sensed; and when the match result is all mismatch, a lowest current is sensed.

Fourth Embodiment

Figure 4A:
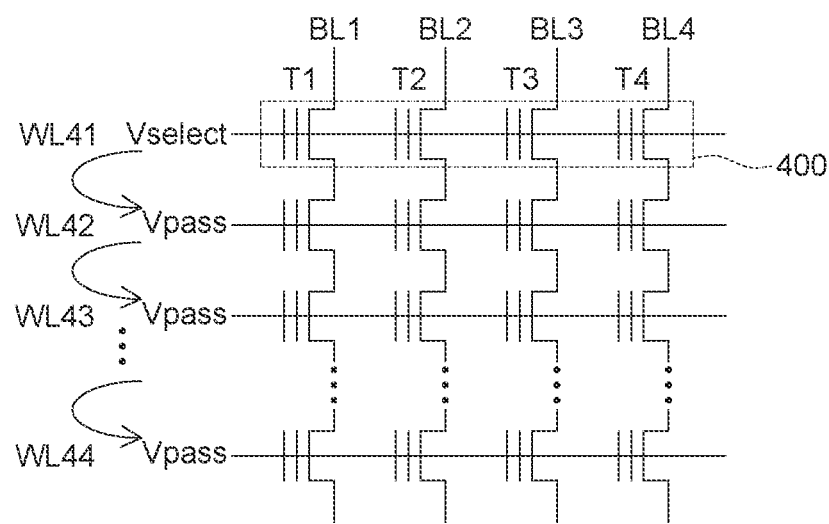
FIG. 4A is a schematic diagram of a CAM memory cell and the threshold voltage distribution according to a fourth embodiment of the present application.
Figure 4A:
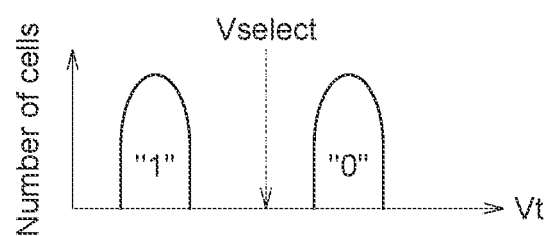

FIG. 4A is a schematic diagram of a CAM memory cell 400 and the threshold voltage distribution according to a fourth embodiment of the present application. The CAM memory cell 400 may for example but not limited by, include four flash memory cells. Gates of the four flash memory cells are coupled together, sources of the four flash memory cells are coupled to the bit lines BL1~BL4 for receiving four search voltages, respectively; and drains of the four flash memory cells are coupled to sources of the flash memory cells of the next CAM memory cell.

As shown in FIG. 4A, in the fourth embodiment of the application, when the flash memory cell has a high threshold voltage HVT, the flash memory cell stores logic 0; and when the flash memory cell has a low threshold voltage LVT, the flash memory cell stores logic 1. Further, the reference search voltages VD and 0V (VD>0V) refer to the possible values of the first search voltage SL_1 to the fourth second search voltage SL_24. For example, the reference search voltage VD is about 1V.

In order to select the CAM memory cell 400, the gates of the flash memory cells of the CAM memory cell 400 receive the select voltage Vselect (between the high threshold voltage HVT and the low threshold voltage LVT) via the word lines WL41~WL44; and in order to unselect the CAM memory cell 400, the gates of the flash memory cells of the CAM memory cell 400 receive the pass voltage Vpass via the word lines WL41~WL44. For example, the pass voltage Vpass is about 7V. When applied by the select voltage Vselect, whether the flash memory cells of the CAM memory cell 400 are conducted or not is based on the threshold voltages of the flash memory cells, wherein when the flash memory cell has the high threshold voltage, the flash memory cell is conducted, and when the flash memory cell has the low threshold voltage, the flash memory cell is conducted. When applied by the pass voltage Vpass, the flash memory cells of the CAM memory cell 400 are conducted.

Moreover, in the fourth embodiment of the present application, encoding on the threshold voltages of the flash memory cells and the first to the fourth search voltages may be used to implement "range storage and single-bit search" and "single-bit storage and range search" as follows.

"Range storage and single-bit search" in the fourth embodiment of the present application:

hi the fourth embodiment of the present application, encoding on the threshold voltages of the flash memory cells T1~T4 and the first to the fourth search voltages SL1~SL4 may be used to implement "range storage and single-bit search" as the following table 4-1.

TABLE 4-1

| Storage data | Threshold voltages | Search data | Search voltages |
|---|---|---|---|
| Invalid data | 1111 | Invalid data | VD VD VD VD |
| 0 | 1110 | 0 | 0V 0V 0V VD |
| 1 | 1101 | 1 | 0V 0V VD 0V |
| 2 | 1011 | 2 | 0V VD 0V 0V |
| 3 | 0111 | 3 | VD 0V 0V 0V |
| 0, 1 | 1100 | N/A | N/A |
| 2, 3 | 0011 | N/A | N/A |
| 0, 2 | 1010 | N/A | N/A |
| 1, 3 | 0101 | N/A | N/A |
| 1, 2 | 1001 | N/A | N/A |
| 0, 3 | 0110 | N/A | N/A |
| 0, 1, 2 | 1000 | N/A | N/A |
| 1, 2, 3 | 0001 | N/A | N/A |
| 0, 2, 3 | 0010 | N/A | N/A |
| 0, 1, 3 | 0100 | N/A | N/A |
| 0, 1, 2, 3 (XX) | 0000 | 0, 1, 2, 3 (WC) | 0V 0V 0V 0V |

In the table 4-1, when the threshold voltages of the flash memory cells T1~T4 are 1101; storage data of the CAM memory cell 400 is "1"; and when the search voltages SL_1~SL_4 are 0V, 0V, VD and 0V, respectively, the search data is "1".

"Single-bit storage and range search" in the fourth embodiment of the present application:

In the fourth embodiment of the present application, encoding on the threshold voltages of the flash memory cells T1~T4 and the first to the fourth search voltages SL_1~SL_4 may be used to implement "single-bit storage and range search" as the following table 4-2.

TABLE 4-2

| Storage data | Threshold voltages | Search data | Search voltages |
|---|---|---|---|
| Invalid data | 0000 | Invalid data | VD VD VD VD |
| 0 | 0001 | 0 | VD VD VD 0V |
| 1 | 0010 | 1 | VD VD 0V VD |
| 2 | 0100 | 2 | VD 0V VD VD |
| 3 | 1000 | 3 | 0V VD VD VD |
| N/A | N/A | 0, 1 | VD VD 0V 0V |
| N/A | N/A | 2, 3 | 0V 0V VD VD |
| N/A | N/A | 0, 2 | VD 0V VD 0V |
| N/A | N/A | 1, 3 | 0V VD 0V VD |
| N/A | N/A | 1, 2 | VD 0V 0V VD |
| N/A | N/A | 0, 3 | 0V VD VD 0V |
| N/A | N/A | 0, 1, 2 | VD 0V 0V 0V |
| N/A | N/A | 1, 2, 3 | 0V 0V 0V VD |
| N/A | N/A | 0, 2, 3 | 0V 0V VD 0V |

TABLE 4-2-continued

| Storage data | Threshold voltages | Search data | Search voltages |
|---|---|---|---|
| N/A | N/A | 0, 1, 3 | 0V VD 0V 0V |
| 0, 1, 2, 3 (XX) | 1111 | 0, 1, 2, 3 (WC) | 0V 0V 0V 0V |

Figure 4B:
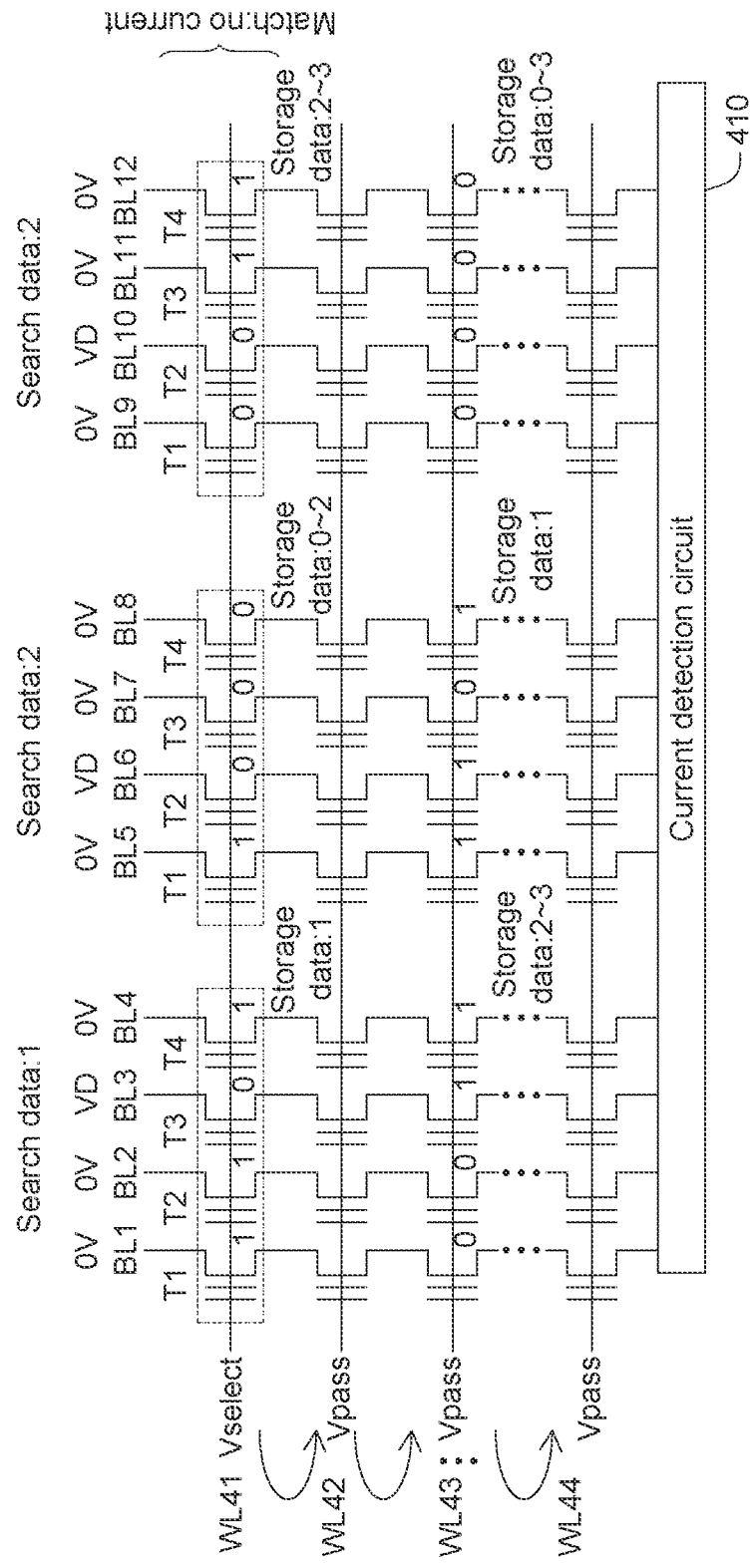
FIG. 4B and FIG. 4C show "range storage and single-bit search" operation according to the fourth embodiment of the application.
Figure 4C:
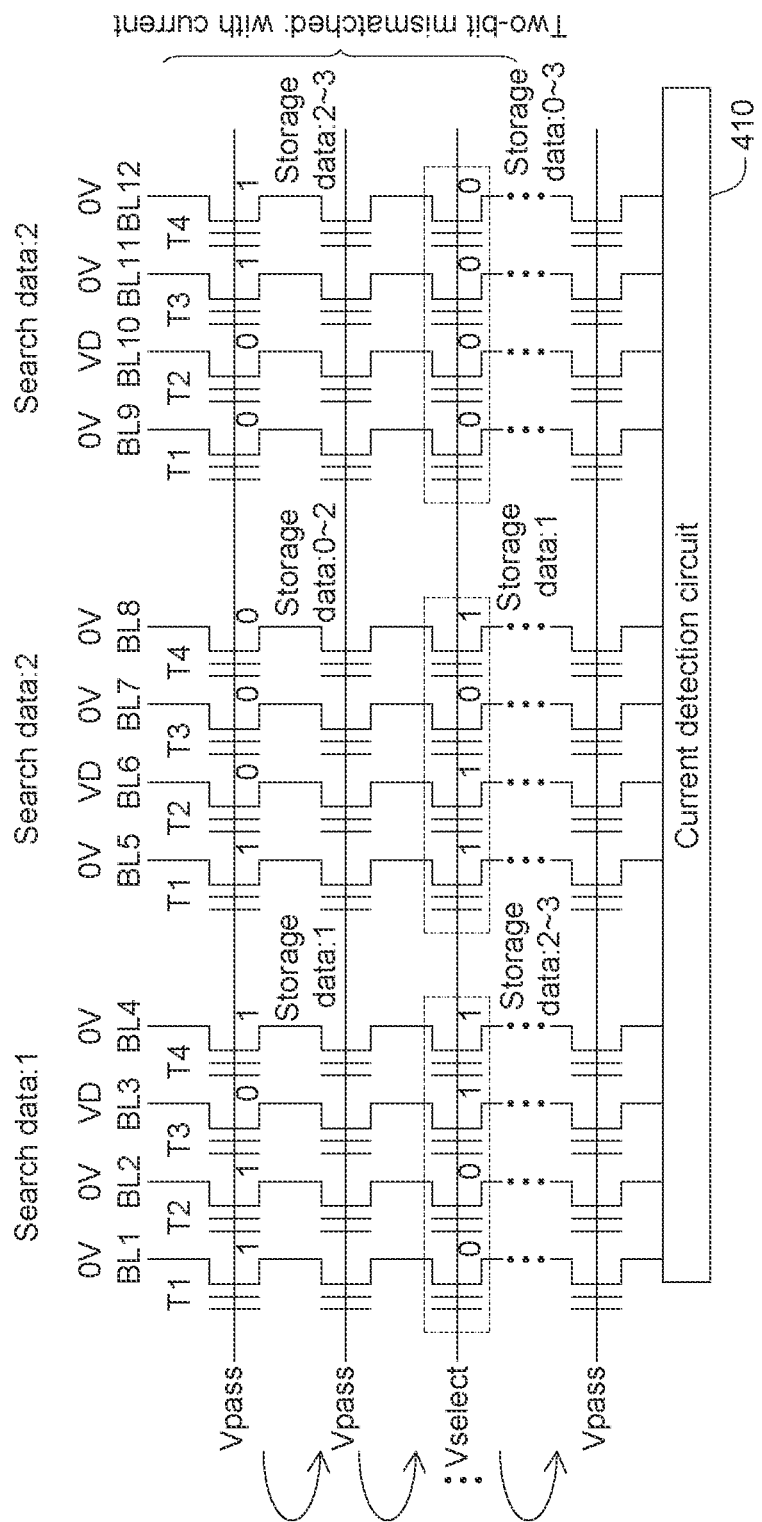

FIG. 4A also shows the threshold voltage distribution in the fourth embodiment of the application. In the fourth embodiment of the application, when the search data is matched with the storage data, the CAM memory cell 400 does not provide the cell current; and when the search data is mismatched with the storage data, the CAM memory cell 400 provides the cell current, FIG. 4B and FIG. 4C show "range storage and single-bit search" operation according to the fourth embodiment of the application. The CAM memory cells have storage data as shown. Search data being 1, 2 and 2 is taken as an example. The search data is input into the CAM memory cells via the bit lines BL1~BL12.

Taking the selected word line WL41 as an example. The search data is 1 (the search voltages are 0V, 0V, VD and 0V) and the four threshold voltages of the first CAM memory cell on the word line WL41 are 1101 (the CAM memory cell has range storage as 1). Thus, none of the four flash memory cells of the first CAM memory cell on the word line WL41 provides the cell current. The search data is 2 (the search voltages are 0V, VD, 0V and 0V) and the four threshold voltages of the second CAM memory cell on the word line WL41 are 1000 (the second CAM memory cell has range storage as 0~2). Thus, none of the flash memory cells of the second CAM memory cell on the word line WL41 provides the cell current. The search data is 2 (the search voltages are 0V, VD, 0V and 0V) and the four threshold voltages of the third CAM memory cell on the word line WL41 are 0011 (the third CAM memory cell has range storage as 2~3). Thus, none of the flash memory cells of the third CAM memory cell on the word line WL41 provides the cell current. The current detection on the word line WL41 by the current detection circuit 410 indicates all match (no current).

Similarly, in FIG. 4C, the current detection on the word line WL43 by the current detection circuit 410 indicates two-bit mismatch (with current), wherein the first and the second CAM memory cells on the word line WL43 provide currents (mismatched) while the third CAM memory cell on the word line WL43 does not provide the current (matched).

That is, in the fourth embodiment of the application, when the match result is all match, no current is sensed; when the match result is partial match, an intermediate current is sensed; and when the match result is all mismatch, a highest current is sensed.

Fifth Embodiment

Figure 5A:
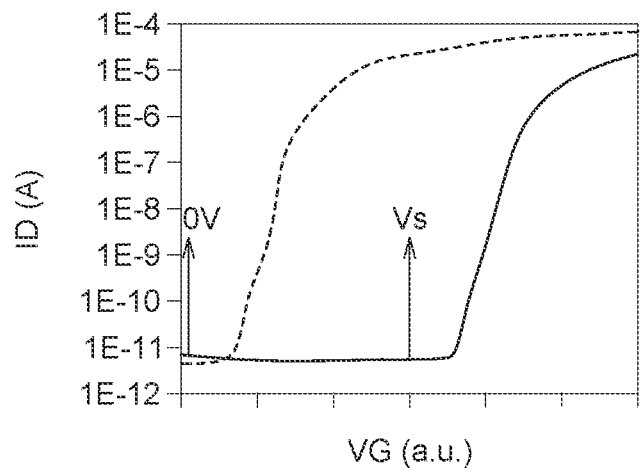
FIG. 5A is a schematic diagram of a CAM memory cell and the threshold voltage distribution according to a fifth embodiment of the present application.
Figure 5A:
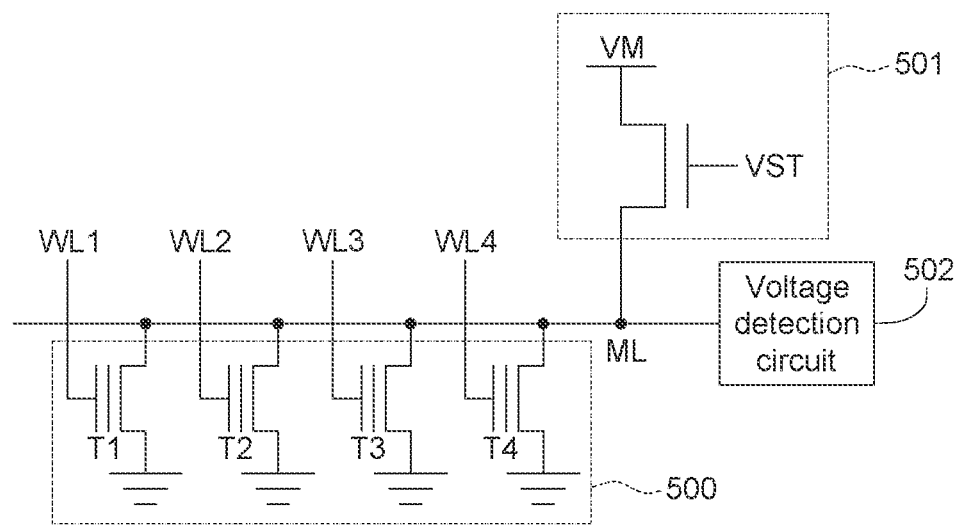

FIG. 5A is a schematic diagram of a CAM memory cell 500 and the threshold voltage distribution according to a fifth embodiment of the present application. The CAM memory cell 500 may for example but not limited by, include four flash memory cells. Gates of the four flash memory cells are coupled to the word lines WL1~WL4 for receiving the search voltages, sources of the four flash memory cells are coupled to the match line; and drains of the four flash memory cells are coupled to ground.

As shown in FIG. 5A, in the fifth embodiment of the application, when the flash memory cell has a high threshold voltage HVT, the flash memory cell stores logic 0; and when the flash memory cell has a low threshold voltage LVT, the flash memory cell stores logic 1. Further, the reference search voltages VS and 0V (VS>0V) refer to the possible values of the first search voltage SL_1 to the fourth second search voltage SL4. For example, the reference search voltage VS is about 3V.

In order to search the CAM memory cell 500, the gates of the flash memory cells of the CAM memory cell 500 receive the search voltages via the word lines WL1~WL4. Each match line ML is coupled to a pre-charge control circuit 501. The pre-charge control circuit 501 is for example but not limited by, implemented by a transistor having a gate for receiving a start voltage VST, a source coupled to a reference voltage VM and a drain coupled to the match line ML. The match line ML is further coupled to a voltage detection circuit 502 (also referred as an electrical characteristic detection circuit). Before search, the start voltage VST turns on the pre-charge control circuit 501 to pre-charge the match ML to the reference voltage VM.

Moreover, in the fifth embodiment of the present application, encoding on the threshold voltages of the flash memory cells and the first to the fourth search voltages may be used to implement "range storage and single-bit search" and "single-bit storage and range search" as follows.

"Range storage and single-bit search" in the fifth embodiment of the present application:

In the fifth embodiment of the present application, encoding on the threshold voltages of the flash memory cells T1~T4 and the first to the fourth search voltages SL_1~SL_4 may be used to implement "range storage and single-bit search" as the following table 5-1.

TABLE 5-1

| Storage data | Threshold voltages | Search data | Search voltages |
|---|---|---|---|
| Invalid data | 1111 | Invalid data | VS VS VS VS |
| 0 | 1110 | 0 | 0V 0V 0V VS |
| 1 | 1101 | 1 | 0V 0V VS 0V |
| 2 | 1011 | 2 | 0V VS 0V 0V |
| 3 | 0111 | 3 | VS 0V 0V 0V |
| 0, 1 | 1100 | N/A | N/A |
| 2, 3 | 0011 | N/A | N/A |
| 0, 2 | 1010 | N/A | N/A |
| 1, 3 | 0101 | N/A | N/A |
| 1, 2 | 1001 | N/A | N/A |
| 0, 3 | 0110 | N/A | N/A |
| 0, 1, 2 | 1000 | N/A | N/A |
| 1, 2, 3 | 0001 | N/A | N/A |
| 0, 2, 3 | 0010 | N/A | N/A |
| 0, 1, 3 | 0100 | N/A | N/A |
| 0, 1, 2, 3 (XX) | 0000 | 0, 1, 2, 3 (WC) | 0V 0V 0V 0V |

In the table 5-1, when the threshold voltages of the flash memory cells T1~T4 are 1101, storage data of the CAM memory cell 500 is "1"; and when the search voltages SL1~SL4 are 0V, 0V, VS and 0V, respectively, the search data is "1".

"Single-bit storage and range search" in the fifth embodiment of the present application:

In the fifth embodiment of the present application, encoding on the threshold voltages of the flash memory cells T1~T4 and the first to the fourth search voltages SL_1~SL_4 may be used to implement "single-bit storage and range search" as the following table 5-2,

TABLE 5-2

| Storage data | Threshold voltages | Search data | Search voltages |
|---|---|---|---|
| Invalid data | 1111 | Invalid data | VS VS VS VS |
| 0 | 0001 | 0 | VS VS VS 0V |
| 1 | 0010 | 1 | VS VS 0V VS |
| 2 | 0100 | 2 | VS 0V VS VS |
| 3 | 1000 | 3 | 0V VS VS VS |
| N/A | N/A | 0, 1 | VS VS 0V 0V |
| N/A | N/A | 2, 3 | 0V 0V VS VS |
| N/A | N/A | 0, 2 | VS 0V VS 0V |
| N/A | N/A | 1, 3 | 0V VS 0V VS |
| N/A | N/A | 1, 2 | VS 0V 0V VS |
| N/A | N/A | 0, 3 | 0V VS VS 0V |
| N/A | N/A | 0, 1, 2 | VS 0V 0V 0V |
| N/A | N/A | 1, 2, 3 | 0V 0V 0V VS |
| N/A | N/A | 0, 2, 3 | 0V 0V VS 0V |
| N/A | N/A | 0, 1, 3 | 0V VS 0V 0V |
| 0, 1, 2, 3 (XX) | 0000 | 0, 1, 2, 3 (WC) | 0V 0V 0V 0V |

FIG. 5A also shows the threshold voltage distribution in the fifth embodiment of the application. In the fifth embodiment of the application wen the search data is matched with the storage data, the CAM memory cell 500 is not conducted and thus the match line voltage is kept; and when the search data is mismatched with the storage data, the CAM memory cell 500 is conducted to discharge the match line voltage.

Figure 5B:
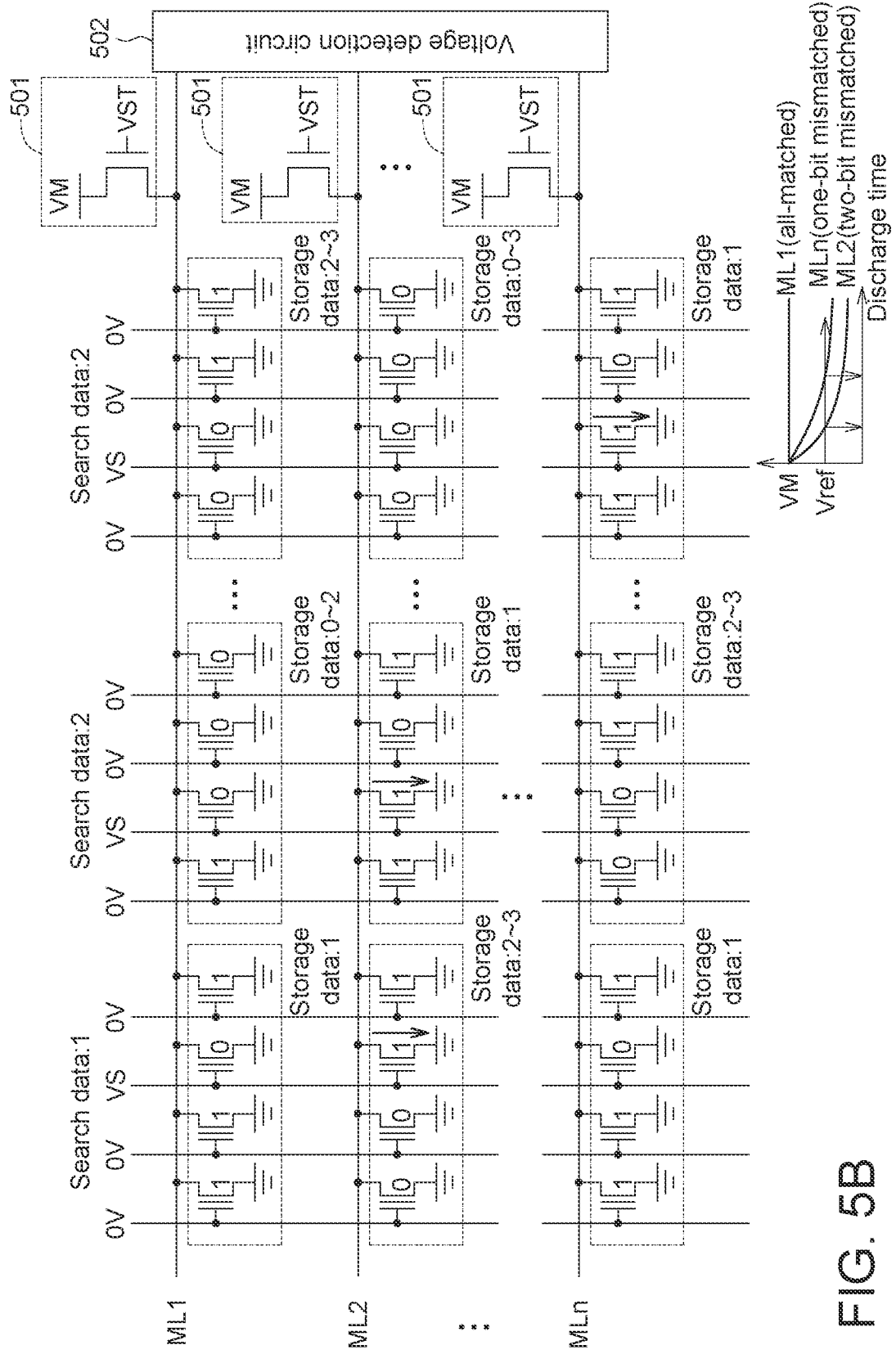
FIG. 5B shows "range storage and single-bit search" operation according to the fifth embodiment of the application.

FIG. 5B shows "range storage and single-bit search" operation according to the fifth embodiment of the application. The CAM memory cells have storage data as shown. Search data being 1, 2 and 2 is taken as an example. The search data is input into the CAM memory cells via the word lines.

Taking the match line MLA as an example. The search data is 1 (the search voltages are 0V, 0V, VS and 0V) and the four threshold voltages of the first CAM memory cell on the match line ML1 are 1101 (the CAM memory cell has range storage as 1). Thus, none of the four flash memory cells of the first CAM memory cell on the match line ML1 provides the cell current. The search data is 2 (the search voltages are 0V, VS, 0V and 0V) and the four threshold voltages of the second CAM memory cell on the match line ML1 are 1000 (the second CAM memory cell has range storage as 0-2). Thus, none of the flash memory cells of the second CAM memory cell on the match line ML1 provides the cell current. The search data is 2 (the search voltages are 0V, VS, 0V and 0V) and the four threshold voltages of the third CAM memory cell on the match line ML1 are 0011 (the third CAM memory cell has range storage as 2~3). Thus, none of the flash memory cells of the third CAM memory cell on the match line ML1 provides the cell current. Because none of the CAM memory cells on the match line MLA is conducted, the match line ML1 is not discharged. The match line ML1 is kept at the reference voltage VM. The search result on the match line ML1 indicates all match (no discharge current).

Similarly, in FIG. 5B, two CAM memory cells on the match line ML2 are conducted to discharge the match line ML2. That is, the search result on the match line ML2 indicates two-bit mismatch. One CAM memory cell on the match line MLn is conducted to discharge the match line MLn. That is, the search result on the match line MLn indicates one-bit mismatch. When there are more mismatched bits (i.e. there are more CAM memory cells on the match line are conducted), discharge on the match line is faster.

That is, in the fifth embodiment of the application, whether the match result on the match line is all match, partial match or all mismatch is based on the discharge degree on the match line.

Sixth Embodiment

Figure 6A:
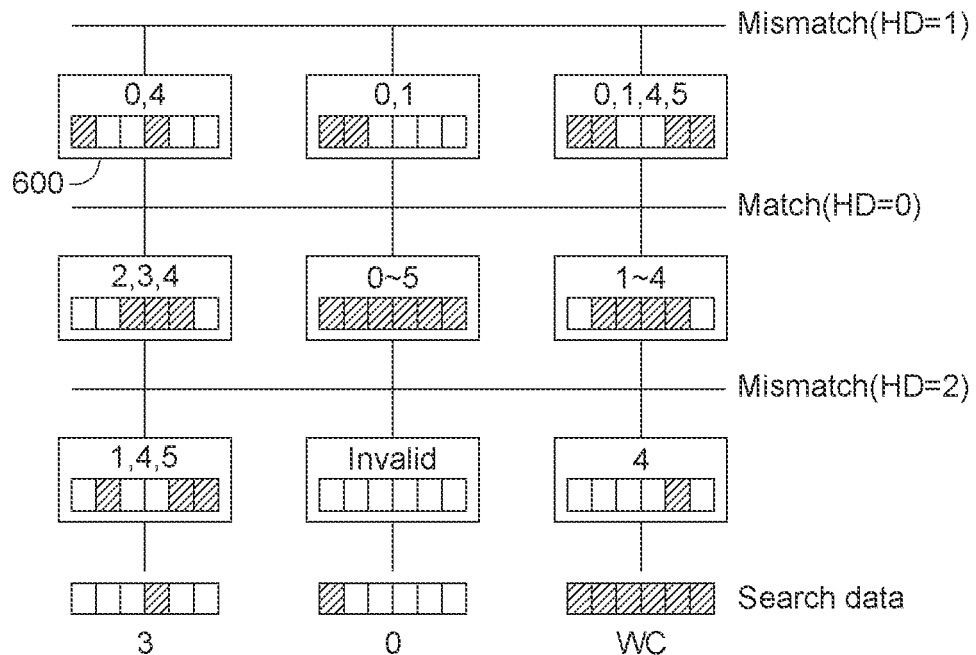
FIG. 6A and FIG. 6B show "range storage and single-bit search" and "single-bit storage and range search" operation according to the sixth embodiment of the application.
Figure 6B:
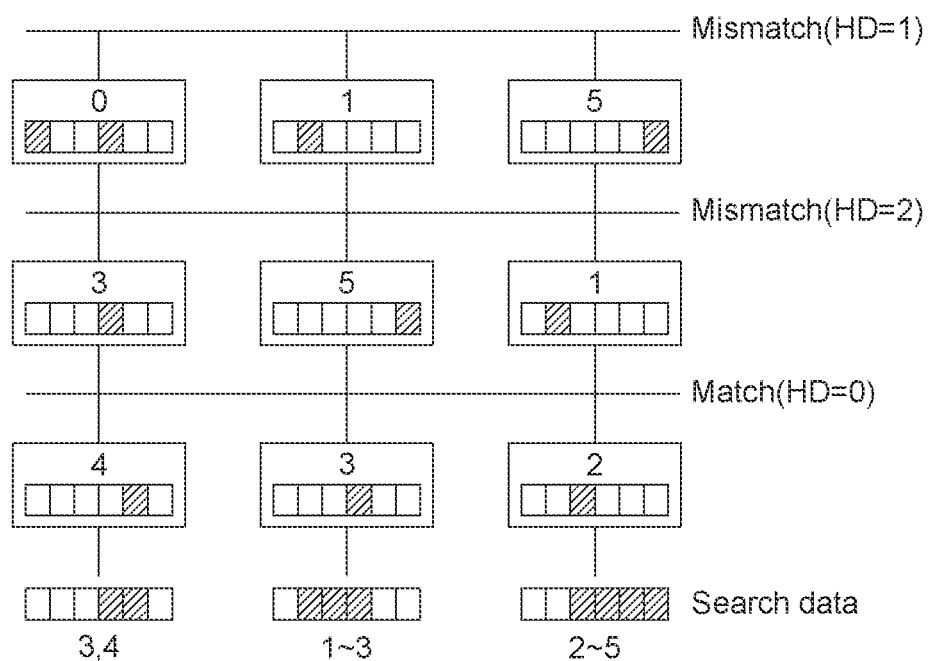

FIG. 6A and FIG. 6B show "range storage and single-bit search" and "single-bit storage and range search" operation according to the sixth embodiment of the application. In the sixth embodiment of the present application, encoding on the threshold voltages of the flash memory cells and the first to the fourth search voltages SL_1~SL4 may be used to implement "range storage and single-bit search" and "single-bit storage and range search". In FIG. 6A and FIG. 6B, a single CAM memory cell includes six flash memory cells, but the application is not limited by this.

In FIG. 6A and FIG. 6B, the match result is used to indicate the Hamming distance (HD) between the search data and the storage data.

Figure 7:
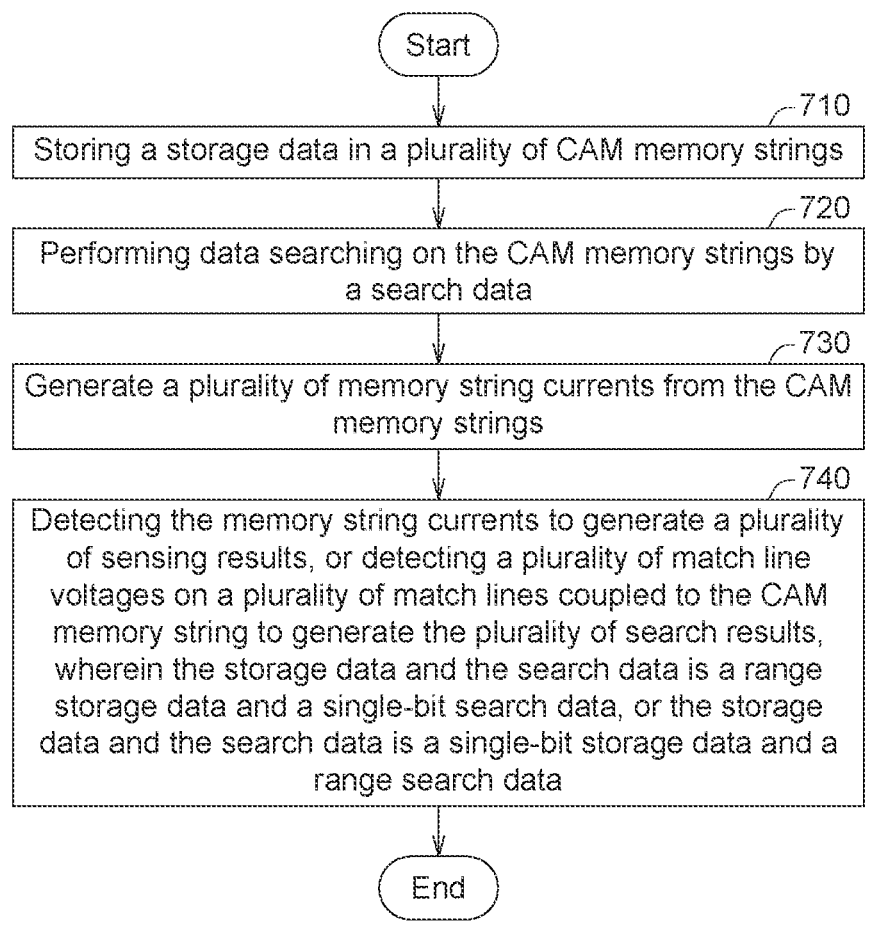
FIG. 7 shows a flow chart of a method for searching and comparing data for a CAM memory device according to one embodiment of the application.

FIG. 7 shows a flow chart of a method for searching and comparing data for a CAM memory device according to one embodiment of the application. The data search and comparing method for the CAM memory device comprises: storing a storage data in a plurality of CAM memory strings (710); performing data searching on the CAM memory strings by a search data (720); generate a plurality of memory string currents from the CAM memory strings (730); and detecting the memory string currents to generate a plurality of sensing results, or detecting a plurality of match line voltages on a plurality of match lines coupled to the CAM memory string to generate the plurality of search results, wherein the storage data and the search data is a range storage data and a single-bit search data, or the storage data and the search data is a single-bit storage data and a range search data (740).

In above embodiments of the present application, the CAM memory device can be realized as a two-dimensional (2D) flash memory architecture or a three-dimensional (3D) flash memory architecture, and is still within the spirit of the present application.

In one embodiment of the application, in performing in-memory approximate search, data search and data comparison are completed during one read cycle. Accompanied by high storage density of the CAM memory device, the in-memory approximate search may be applicable in different field, for example but not limited by, Big-data searching, AI (artificial intelligence) hardware accelerator/classifier, Approximate Computing, Associative memory, Solid-state drive (SSD) data management, deoxyribonucleic acid (DNA) matching, Data filter and so on.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A content addressable memory (CAM) memory device, comprising:
    a plurality of CAM memory strings; and
    an electrical characteristic detection circuit coupled to the CAM memory strings;
    wherein
        in data searching, a search data is compared with a storage data stored in the CAM memory strings, the CAM memory strings generate a plurality of memory string currents, the electrical characteristic detection circuit detects the memory string currents to generate a plurality of sensing results, or the electrical characteristic detection circuit detects a plurality of match line voltages on a plurality of match lines coupled to the CAM memory string to generate the plurality of search results;
        the storage data and the search data is a range storage data and a single-bit search data, or the storage data and the search data is a single-bit storage data and a range search data,
        a CAM memory cell of the CAM memory string includes N1 memory cells (N1 being a positive integer larger than or equal to 3), when the CAM memory cell is encoded for storing M1 decimal data combinations (wherein M1 being a positive integer, M1 >1 and M1<N1), M1 memory cells of the memory cells are programmed to have a first threshold voltage, and (N1-M1) memory cells of the memory cells are programmed to have a second threshold voltage; and
        the search data is defined by N2 search voltages (N2 being a positive integer larger than or equal to 3), when the search data is encoded for M2 decimal data combinations (wherein M2 being a positive integer, M2≥1 and M2≤N2), M2 search voltages of the search voltages have a first search voltage, and (N2−M2) search voltages of the search voltages have a second search voltage.

2. The CAM memory device according to claim 1, wherein
    when the search data is matched with the storage data, the electrical characteristic detection circuit detects the memory string current.

3. The CAM memory device according to claim 1, wherein
    when the search data is mismatched with the storage data, the electrical characteristic detection circuit detects the memory string current.

4. The CAM memory device according to claim 1, wherein
    based on the search results, a match degree between the search data and the storage data is determined as one of the follows: all-matched, partially-matched and all-mismatched.

5. The CAM memory device according to claim 4, wherein
    when the search data is all-matched with the storage data, the electrical characteristic detection circuit detects a first memory string current;
    when the search data is partially-matched with the storage data, the electrical characteristic detection circuit detects a second memory string current; and
    when the search data is all-mismatched with the storage data, the electrical characteristic detection circuit detects a third memory string current;
    the first memory string current is higher than the second memory string current; and the second memory string current is higher than the third memory string current.

6. The CAM memory device according to claim 4, wherein
    when the search data is all-matched with the storage data, the electrical characteristic detection circuit detects a first memory string current;
    when the search data is partially-matched with the storage data, the electrical characteristic detection circuit detects a second memory string current; and
    when the search data is all-mismatched with the storage data, the electrical characteristic detection circuit detects a third memory string current;
    the first memory string current is lower than the second memory string current; and the second memory string current is lower than the third memory string current.

7. The CAM memory device according to claim 4, further including a pre-charge control circuit coupled to the match lines,
    wherein before searching, the pre-charge control circuit pre-charges the match lines to a reference voltage,
    wherein
    when the search data is all-matched with the storage data, the electrical characteristic detection circuit detects a first match line voltage;
    when the search data is partially-matched with the storage data, the electrical characteristic detection circuit detects a second match line voltage; and
    when the search data is all-mismatched with the storage data, the electrical characteristic detection circuit detects a third match line voltage;
    the first match line voltage is higher than the second match line voltage; and the second match line voltage is higher than the third match line voltage.

8. A data search and comparing method for a content addressable memory (CAM) memory device, the method comprising:
    storing a storage data in a plurality of CAM memory strings;
    performing data searching on the CAM memory strings by a search data;
    generate a plurality of memory string currents from the CAM memory strings;
    detecting the memory string currents to generate a plurality of sensing results, or detecting a plurality of match line voltages on a plurality of match lines coupled to the CAM memory string to generate the plurality of search results;
    wherein the storage data and the search data is a range storage data and a single-bit search data, or the storage data and the search data is a single-bit storage data and a range search data,
    a CAM memory cell of the CAM memory string includes N1 memory cells (N1 being a positive integer larger than or equal to 3), when the CAM memory cell is encoded for storing M1 decimal data combinations (wherein M1 being a positive integer, M1≥1 and M1≤N1), M1 memory cells of the memory cells are programmed to have a first threshold voltage, and (N1-M1) memory cells of the memory cells are programmed to have a second threshold voltage; and
    the search data is defined by N2 search voltages (N2 being a positive integer larger than or equal to 3), when the search data is encoded for M2 decimal data combinations (wherein M2 being a positive integer, M2>1 and M2<N2), M2 search voltages of the search voltages have a first search voltage, and (N2-M2) search voltages of the search voltages have a second search voltage.

9. The data search and comparing method for CAM memory device according to claim 8, wherein
when the search data is matched with the storage data, the memory string current is detected.

10. The data search and comparing method for CAM memory device according to claim 8, wherein
the memory string current is detected when the search data is mismatched with the storage data.

11. The data search and comparing method for CAM memory device according to claim 8, wherein
based on the search results, a match degree between the search data and the storage data is determined as one of the follows: all-matched, partially-matched and all-mismatched.

12. The data search and comparing method for CAM memory device according to claim 11, wherein
when the search data is all-matched with the storage data, a first memory string current is detected;
when the search data is partially-matched with the storage data, a second memory string current is detected; and
when the search data is all-mismatched with the storage data, a third memory string current is detected;
the first memory string current is higher than the second memory string current; and the second memory string current is higher than the third memory string current.

13. The data search and comparing method for CAM memory device according to claim 11, wherein
when the search data is all-matched with the storage data, a first memory string current is detected;
when the search data is partially-matched with the storage data, a second memory string current is detected; and
when the search data is all-mismatched with the storage data, a third memory string current is detected;
the first memory string current is lower than the second memory string current; and the second memory string current is lower than the third memory string current.

14. The data search and comparing method for CAM memory device according to claim 11, wherein
before searching, pre-charging the match lines to a reference voltage,
when the search data is all-matched with the storage data, a first match line voltage is detected;
when the search data is partially-matched with the storage data, a second match line voltage is detected; and
when the search data is all-mismatched with the storage data, a third match line voltage is detected;
the first match line voltage is higher than the second match line voltage; and the second match line voltage is higher than the third match line voltage.

15. A content addressable memory (CAM) memory cell including:
N1 memory cells (N1 being a positive integer larger than or equal to 3), wherein
the memory cell are serially connected, and a plurality of control terminals of the memory cells receive a plurality of search voltages indicating a search data; or
the plurality of control terminals of the memory cells receive a select voltage or a pass voltage, and a plurality of first terminals of the memory cells receive the search voltages via a plurality of signal lines; or
the plurality of control terminals of the memory cells are coupled to a plurality of word lines for receiving the search voltages, the first terminals of the memory cells are coupled to a match line and a pre-charge control circuit, and a plurality of second terminals of the memory cells are coupled to ground,
wherein a storage data of the CAM memory cell and the search data is a range storage data and a single-bit search data, or the storage data and the search data is a single-bit storage data and a range search data,
when the CAM memory cell is encoded for storing M1 decimal data combinations (wherein M1 being a positive integer, $M1 \geq 1$ and $M1 \leq N1$), M1 memory cells of the memory cells are programmed to have a first threshold voltage, and (N1−M1) memory cells of the memory cells are programmed to have a second threshold voltage; and
the search data is defined by N2 search voltages (N2 being a positive integer larger than or equal to 3), when the search data is encoded for M2 decimal data combinations (wherein M2 being a positive integer, $M2 \geq 1$ and $M2 \leq N2$), M2 search voltages of the search voltages have a first search voltage, and (N2−M2) search voltages of the search voltages have a second search voltage.

* * * * *